United States Patent
Chen et al.

(10) Patent No.: US 11,967,642 B2
(45) Date of Patent: Apr. 23, 2024

(54) SEMICONDUCTOR STRUCTURE, HIGH ELECTRON MOBILITY TRANSISTOR AND FABRICATION METHOD THEREOF

(71) Applicant: Vanguard International Semiconductor Corporation, Hsinchu (TW)

(72) Inventors: Chih-Yen Chen, Hsinchu (TW); Tuan-Wei Wang, New Taipei (TW); Franky Juanda Lumbantoruan, Sumatera Utara (ID); Chun-Yang Chen, New Taipei (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 440 days.

(21) Appl. No.: 17/465,881

(22) Filed: Sep. 3, 2021

(65) Prior Publication Data

US 2023/0070031 A1    Mar. 9, 2023

(51) Int. Cl.
*H01L 29/778*    (2006.01)
*H01L 21/02*    (2006.01)
*H01L 23/29*    (2006.01)
*H01L 23/31*    (2006.01)
*H01L 29/20*    (2006.01)
(Continued)

(52) U.S. Cl.
CPC ...... *H01L 29/7787* (2013.01); *H01L 21/0254* (2013.01); *H01L 21/02576* (2013.01); *H01L 21/02579* (2013.01); *H01L 23/291* (2013.01); *H01L 23/3171* (2013.01); *H01L 29/2003* (2013.01); *H01L 29/205* (2013.01); *H01L 29/207* (2013.01); *H01L 29/66462* (2013.01)

(58) Field of Classification Search
None
See application file for complete search history.

(56) References Cited

U.S. PATENT DOCUMENTS

2005/0077541 A1* 4/2005 Shen .............. H01L 29/7787
257/E29.253
2013/0341635 A1* 12/2013 Cao .............. H01L 29/205
438/172
(Continued)

FOREIGN PATENT DOCUMENTS

TW    201814777 A    4/2018
TW    202105473 A    2/2021

*Primary Examiner* — Khaja Ahmad
(74) *Attorney, Agent, or Firm* — Winston Hsu

(57) ABSTRACT

A semiconductor structure includes a buffer layer, a channel layer, a barrier layer, a doped compound semiconductor layer, and a composition gradient layer. The buffer layer is disposed on a substrate, the channel layer is disposed on the buffer layer, the barrier layer is disposed on the channel layer, the doped compound semiconductor layer is disposed on the barrier layer, and the composition gradient layer is disposed between the barrier layer and the doped compound semiconductor layer. The barrier layer and the composition gradient layer include a same group III element and a same group V element, and the atomic percentage of the same group III element in the composition gradient layer is gradually increased in the direction from the barrier layer to the doped compound semiconductor layer. A high electron mobility transistor and a fabrication method thereof are also provided.

14 Claims, 6 Drawing Sheets

(51) Int. Cl.
  *H01L 29/205* (2006.01)
  *H01L 29/207* (2006.01)
  *H01L 29/66* (2006.01)

(56) References Cited

U.S. PATENT DOCUMENTS

| | | | |
|---|---|---|---|
| 2014/0097470 A1 | 4/2014 | Kim | |
| 2015/0221760 A1* | 8/2015 | Kub | H01L 21/762 |
| | | | 438/172 |
| 2018/0301528 A1* | 10/2018 | Chen | H01L 29/207 |
| 2019/0334023 A1* | 10/2019 | Nakata | H01L 29/2003 |
| 2020/0185514 A1* | 6/2020 | Chen | H01L 29/7786 |
| 2021/0005739 A1* | 1/2021 | Sun | H01L 29/205 |

* cited by examiner

SEMICONDUCTOR STRUCTURE, HIGH ELECTRON MOBILITY TRANSISTOR AND FABRICATION METHOD THEREOF

BACKGROUND OF THE INVENTION

1. Field of the Invention

The present disclosure relates generally to the field of semiconductor devices, and more particularly to a semiconductor structure and a high electron mobility transistor including the semiconductor structure and a fabrication method thereof.

2. Description of the Prior Art

In semiconductor technology, group III-V compound semiconductor may be used to construct various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different band gaps (i.e., a hetero-junction). The 2-DEG layer is used as the transistor channel instead of a doped region, as is generally the case for metal oxide semiconductor field effect transistors (MOSFETs). Compared with MOSFETs, HEMTs have a number of attractive properties such as high electron mobility and the ability to transmit signals at high frequencies. A conventional HEMT may include a channel layer, a barrier layer, a cap layer, and a gate electrode stacked in sequence. Using the gate electrode to apply a bias voltage on the cap layer can adjust the concentration of 2-DEG in the channel layer located under the cap layer, thereby controlling the turn-on/off of the HEMT.

Since the dielectric layer above the barrier layer and the channel layer has compressive stress, through the piezoelectric effect, the surface of the channel layer and the surface of the barrier layer are usually polarized and cause the surface leakage current of the HEMT. Therefore, the electrical performance of the HEMT is reduced.

SUMMARY OF THE INVENTION

In view of this, it is necessary to provide an improved high electron mobility transistor (HEMT) to enhance the electrical performances of the HEMT.

According to one embodiment of the present disclosure, a semiconductor structure is provided and includes a substrate, a buffer layer, a channel layer, a barrier layer, a doped compound semiconductor layer, and a composition gradient layer. The buffer layer is disposed on the substrate, the channel layer is disposed on the buffer layer, the barrier layer is disposed on the channel layer, the doped compound semiconductor layer is disposed on the barrier layer, and the composition gradient layer is disposed between the barrier layer and the doped compound semiconductor layer. The barrier layer and the composition gradient layer include a same group III element and a same group V element, and the atomic percentage of the same group III element in the composition gradient layer is gradually increased in the direction from the barrier layer to the doped compound semiconductor layer.

According to one embodiment of the present disclosure, a high electron mobility transistor (HEMT) is provided and includes the semiconductor structure, a gate electrode, a source electrode, a drain electrode and a passivation layer. The gate electrode is disposed on the doped compound semiconductor layer. The source electrode and the drain electrode are disposed on two sides of the gate electrode respectively. The passivation layer covers the gate electrode, the source electrode and the drain electrode.

According to one embodiment of the present disclosure, a method of fabricating a high electron mobility transistor is provided and includes the following steps. A substrate having a channel layer and a barrier layer formed in sequence thereon is provided; a composition gradient layer is formed on the barrier layer; and a passivation layer is formed on the composition gradient layer, where the barrier layer and the composition gradient layer include a same group III element and a same group V element, and the atomic percentage of the same group III element in the composition gradient layer is gradually increased in the direction from the barrier layer to the passivation layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
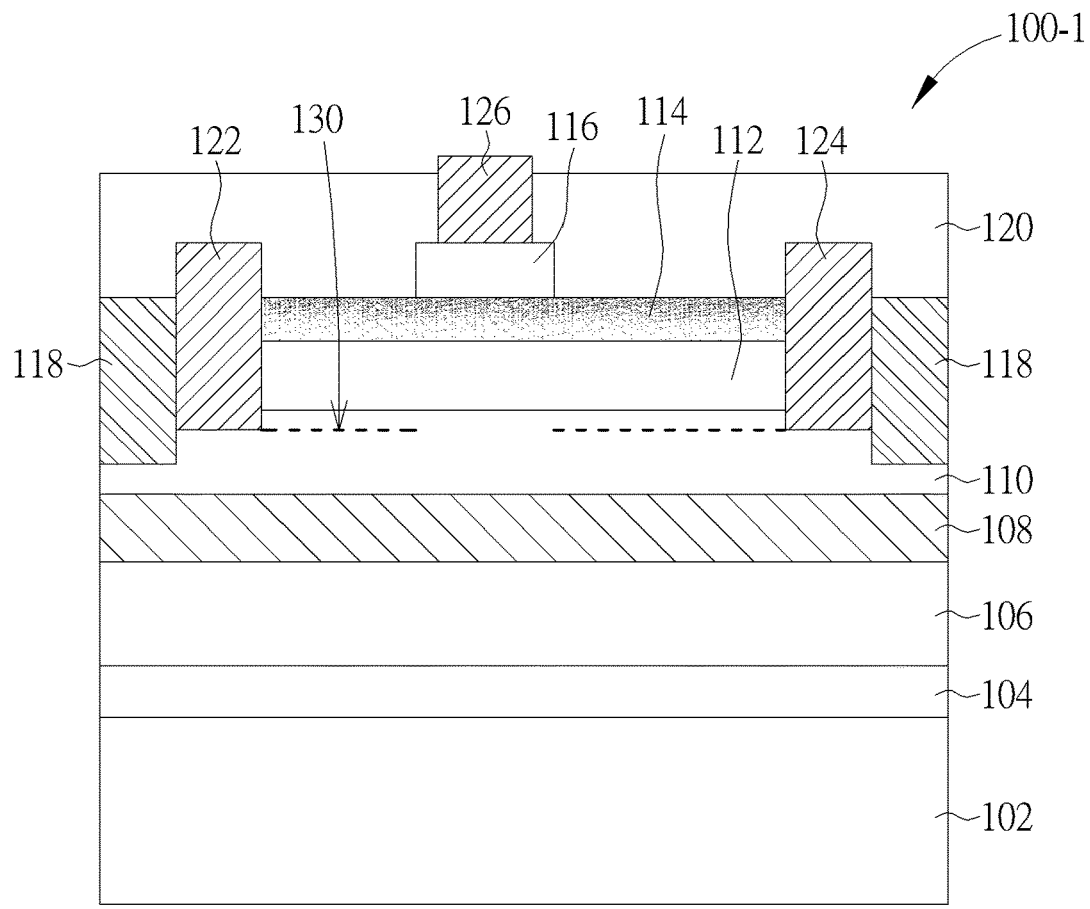
FIG. 1 is a schematic cross-sectional diagram of a high electron mobility transistor (HEMT) according to one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed indirect contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "under", "over", "above", "upper", "bottom", "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "under" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first", "second", and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, group III-V semiconductor may contain dopants to become semiconductor with specific conductivity type, such as n-type or p-type.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to a semiconductor structure and a high electron mobility transistor (HEMT) including the semiconductor structure, which may be used as power switching transistors for voltage converter applications. Compared to silicon power transistors, group III-V semiconductor HEMTs (III-V HEMTs) feature low on-state resistances and low switching losses due to wide band gap properties.

FIG. 1 is a schematic cross-sectional diagram of a HEMT according to one embodiment of the present disclosure. Referring to FIG. 1, according to one embodiment, a HEMT 100-1 such as an enhancement mode HEMT is disposed on a substrate 102. In addition, a buffer layer, a channel layer 110, a barrier layer 112, a composition gradient layer 114, a doped compound semiconductor layer 116, and a passivation layer 120 are disposed on the substrate 102 in sequence. In one embodiment, the buffer layer includes a nucleation layer 104, a superlattice layer (SL) 106, a high resistance layer 108, or a combination thereof. The doped compound semiconductor layer 116 is disposed on the composition gradient layer 114 and is in contact with the composition gradient layer 114. The passivation layer 120 is in contact with the composition gradient layer 114, and the doped compound semiconductor layer 116 is buried in the passivation layer 120. In one embodiment, the passivation layer 120 is in contact with a part of the top surface of the composition gradient layer 114.

In addition, the HEMT 100-1 further includes a gate electrode 126, a source electrode 122, and a drain electrode 124. The gate electrode 126 is disposed on the doped compound semiconductor layer 116 and is covered by or passes through the passivation layer 120. The source electrode 122 and the drain electrode 124 are disposed on two sides of the gate electrode 126 respectively, and are covered by the passivation layer 120. In one embodiment, the source electrode 122 and the drain electrode 124 extend downward and pass through the composition gradient layer 114 and the barrier layer 112 to a depth position in the channel layer 110. The source electrode 122 and the drain electrode 124 are separated from the high resistance layer 108 by a distance. In another embodiment, the source electrode 122 and the drain electrode 124 may extend downward from the passivation layer 120 and pass through the composition gradient layer 114 to a depth position in the barrier layer 112, for example, close to the bottom of the barrier layer 112. In addition, an isolation region 118 is disposed to surround the source electrode 122 and the drain electrode 124 to isolate the adjacent devices from each other. The isolation region 118 passes through the composition gradient layer 114 and the barrier layer 112 to a depth position in the channel layer 110. The bottom of the isolation region 118 is lower than the bottoms of the source electrode 122 and the drain electrode 124, so that the isolation region 118 is closer to the high resistance layer 108 than the source electrode 122 and the drain electrode 124 to achieve a good electrical isolation effect, but the present disclosure is not limited thereto.

According to an embodiment of the disclosure, the channel layer 110 may include one or more group III-V semiconductor layers. The composition of the group III-V semiconductor layer may be GaN, AlGaN, InGaN, or InAlGaN, but not limited thereto. In addition, the channel layer 110 may be one or more group III-V semiconductor layers that are undoped or doped. The doped channel layer 110 is, for example, a p-type group III-V semiconductor layer. For the p-type group III-V semiconductor layer, the dopant may be carbon (C), iron (Fe), magnesium (Mg) or zinc (Zn), but not limited thereto. The barrier layer 112 may include one or more group III-V semiconductor layers, and the composition of the barrier layer 112 is different from the group III-V semiconductor of the channel layer 110. For example, the barrier layer 112 may include AlN, $Al_zGa_{(1-z)}N$ (0<z<1), or a combination thereof. The material of the doped compound semiconductor layer 116 includes a doped compound semiconductor material, such as GaN doped with a p-type dopant or an n-type dopant. In one embodiment, the channel layer 110 may be an undoped GaN layer, and the barrier layer 112 may be an intrinsic n-type AlGaN layer. Since there is a discontinuous energy gap between the channel layer 110 and the barrier layer 112, through stacking the channel layer 110 and the barrier layer 112 on each other, electrons are gathered in the hetero-junction between the channel layer 110 and the barrier layer 112 due to the piezoelectric effect. Therefore, a thin layer with high electron mobility, i.e., a two-dimensional electron gas (2-DEG) region 130 is generated. For normally off devices, when no voltage is applied to the gate electrode 126, the area covered by the doped compound semiconductor layer 116 will not form 2-DEG, which may be regarded as a 2-DEG cut-off region, and there is no conduction between the source electrode 122 and the drain electrode 124. When a positive voltage is applied to the gate electrode 126, the area covered by the doped compound semiconductor layer 116 will form 2-DEG, so that the 2-DEG region 130 between the source electrode 122 and the drain electrode 124 is continuous, and there is conduction between the source electrode 122 and the drain electrode 124. However, the present disclosure is not limited to normally off devices. For normally on devices, when a voltage is applied to the gate electrode 126, the area covered by the doped compound semiconductor layer 116 will not form 2-DEG, which may be regarded as a 2-DEG cut-off region, and there is no conduction between the source electrode 122 and the drain electrode 124 at this time.

According to an embodiment of the disclosure, a composition gradient layer 114 is disposed between the passivation layer 120 and the barrier layer 112, and between the doped compound semiconductor layer 116 and the barrier layer 112. The composition gradient layer 114 is conformally disposed on the surface of the barrier layer 112, and the composition gradient layer 114 covers the entire surface of the barrier layer 112 between the source electrode 122 and the drain electrode 124. According to an embodiment, the barrier layer 112 and the composition gradient layer 114 include a same group III element and a same group V element, and the atomic percentage of the same group III element in the composition gradient layer 114 is gradually increased in the direction from the barrier layer 112 to the passivation layer 120. In other words, in the depth direction, the atomic percentage of the same group III element in the composition gradient layer 114 is gradually increased from bottom to top.

According to the embodiments of the present disclosure, the composition gradient layer 114 may reduce or eliminate the positive polarity on the surface of the barrier layer 112 that is produced by surface polarization, and the lowest conduction band energy level (Ec) of the composition gradient layer 114 may gradually raise from the side close to the barrier layer 112 to the side close to the passivation layer 120, thereby avoiding a potential well between the passivation layer 120 and the barrier layer 112. Through eliminating the potential well, electrons may be prevented from flowing in the potential well, thereby preventing the surface leakage current of the HEMT. Therefore, the electrical performance of the HEMT is improved. Meanwhile, the 2-DEG performance of the HEMT is also maintained. In addition, the placement of the composition gradient layer 114 may also widen the process window of the etching process for forming the doped compound semiconductor layer 116 on the composition gradient layer 114, thereby enhancing the fabrication yield of the HEMT.

However, in a comparative example of a HEMT without the composition gradient layer 114, there is a potential well generated between the barrier layer and the passivation layer due to the compressive stress in the passivation layer which causes the positive charges (or positive polarity) generated on the surface of the barrier layer by the surface polarization. As a result, a parasitic channel is generated between the passivation layer and the barrier layer, such that surface leakage current occurs between the gate electrode and the source electrode, and between the gate electrode and the drain electrode. This surface leakage current will cause the on-off switch of the HEMT of the comparative example to be difficult to control, and affect the electrical performance of the HEMT.

According to an embodiment of the present disclosure, the overall atomic percentage of the same group III element in the composition gradient layer 114 is higher than the atomic percentage of the same group III element in the barrier layer 112. In one embodiment, the barrier layer 112 may include a ternary III-V compound semiconductor, such as aluminum gallium nitride ($Al_zGa_{(1-z)}N$, wherein 0<z<1), and the aforementioned z is a fixed value. The composition gradient layer 114 may include a ternary or quaternary III-V compound semiconductor, such as aluminum gallium nitride ($Al_xGa_{(1-x)}N$, wherein 0.2<x<0.4) or aluminum gallium indium nitride ($Al_xGa_{(1-x-y)}In_yN$, wherein 0.2<x<0.6, and 0<y<0.4), and the aforementioned x and y are numerical values changed with the depth positions. The same group III element is aluminum (Al), and the same group V element is Nitrogen (N). According to an embodiment, the atomic percentage of aluminum (Al) in the composition gradient layer 114 is gradually increased in the direction from the barrier layer 112 to the passivation layer 120. In other words, in the depth direction, the aluminum (Al) atom percentage in the composition gradient layer 114 is gradually increased from bottom to top. In addition, the atomic percentages of other group III elements in the composition gradient layer 114, such as gallium (Ga) and indium (In), is gradually decreased in the direction from the barrier layer 112 to the passivation layer 120. In other words, in the depth direction, the atomic percentages of other group III elements in the composition gradient layer 114 are gradually decreased from bottom to top. In one embodiment, the thickness of the composition gradient layer 114 is 10% to 50% of the thickness of the barrier layer 112. The composition gradient layer 114 in this thickness range will not affect the 2-DEG performance of the HEMT, and may protect the underlying barrier layer 112 during the etching process of forming the doped compound semiconductor layer 116.

Figure 2:
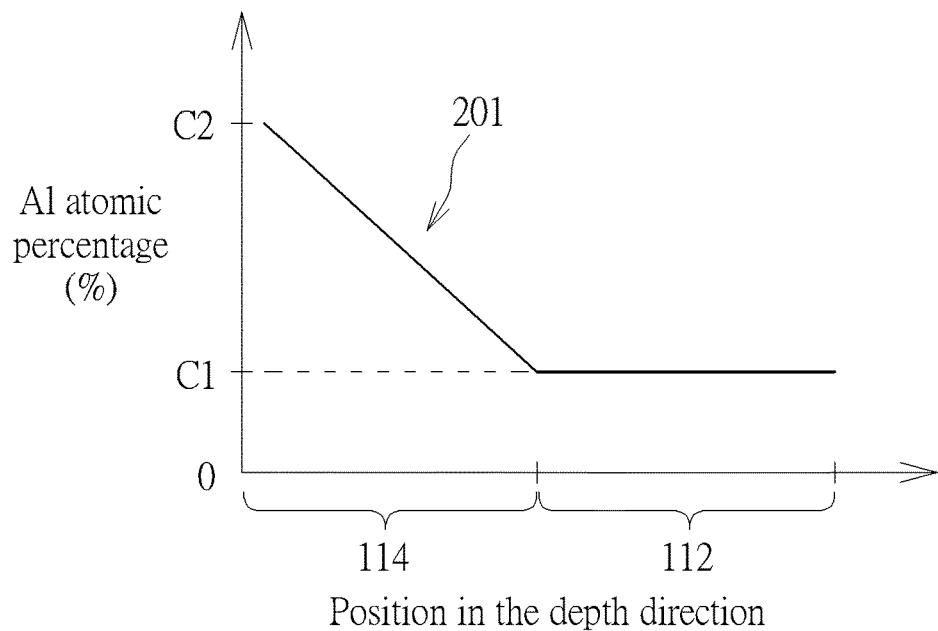
FIG. 2, FIG. 3 and FIG. 4 are the concentration profiles of the atomic percentage of the same group III element such as aluminum (Al) changing with different positions in the depth direction in the composition gradient layer and the barrier layer of the HEMTs according to various embodiments of the present disclosure.
Figure 3:
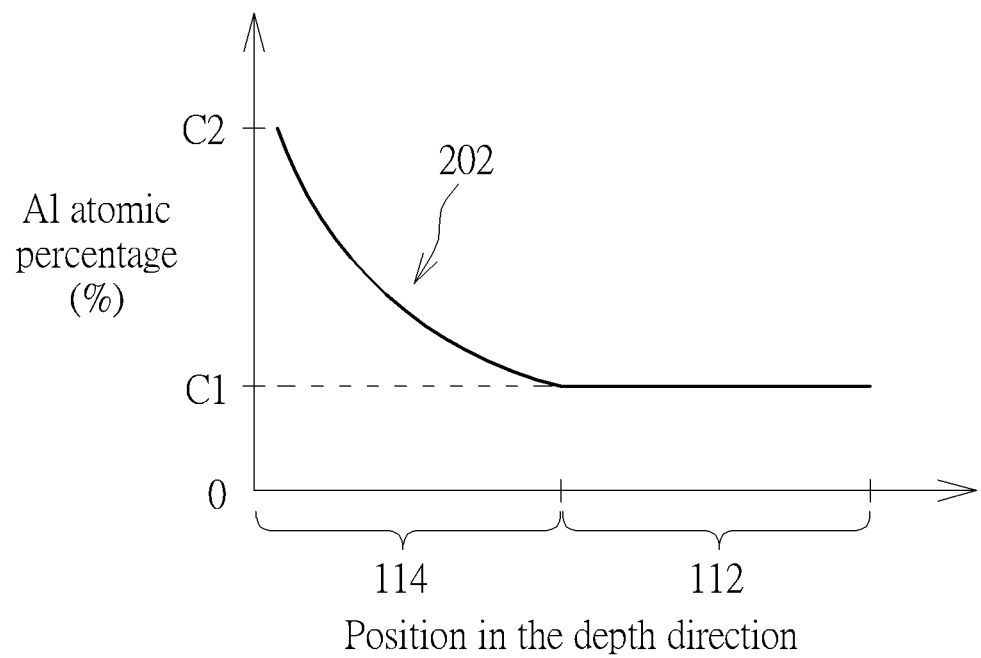
Figure 4:
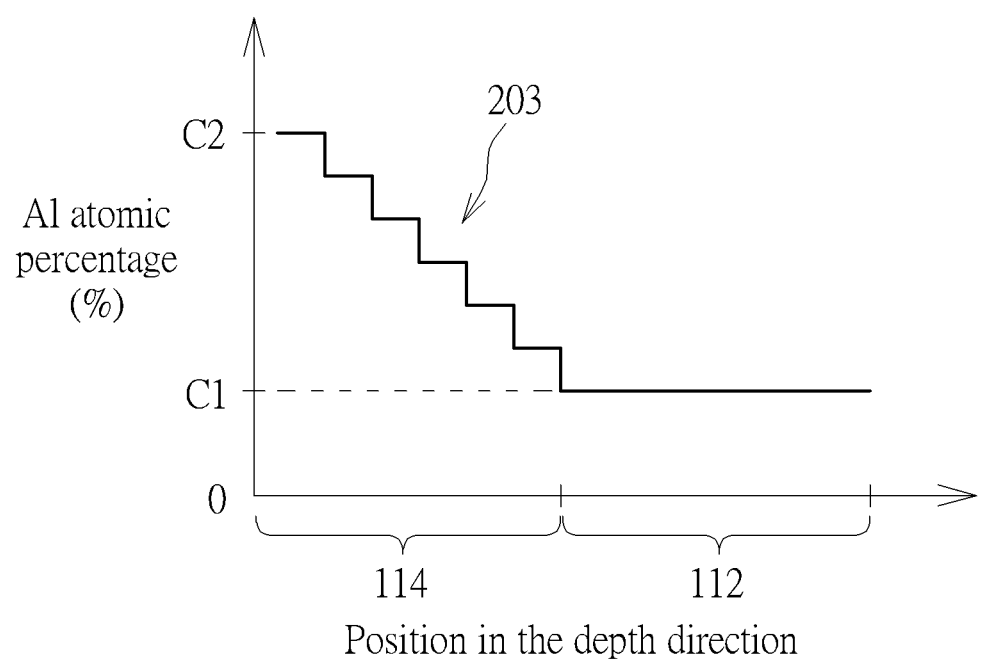

FIG. 2, FIG. 3 and FIG. 4 are the concentration profiles of the atomic percentages of the same group III element such as aluminum (Al) changing with different depth positions in the composition gradient layer and the barrier layer of the HEMT according to various embodiments of the present disclosure. The horizontal axis of FIG. 2 is the positions of the composition gradient layer 114 and the barrier layer 112 in the depth direction, and the vertical axis is the atomic percentage of aluminum (Al). In one embodiment, as shown in FIG. 2, the atomic percentage of aluminum (Al) in the barrier layer 112 is a fixed value C1, and the atomic percentage of aluminum (Al) in the composition gradient layer 114 is gradually increased from bottom to top in the depth direction, that is gradually increased from the value C1 to the value C2, wherein the value C1 is about 20%, and the value C2 is about 40%. The concentration profile of FIG. 2 may be a straight line 201. In other embodiments, the atomic percentage of aluminum (Al) in the composition gradient layer 114 may be gradually increased from other values lower than the value C1 as the starting value to the value C2. According to an embodiment of the present disclosure, the overall atomic percentage of aluminum (Al) in the composition gradient layer 114 is higher than the atomic percentage of aluminum (Al) in the barrier layer 112. In other words, the average atomic percentage of aluminum (Al) in the composition gradient layer 114 is higher than the average atomic percentage of aluminum (Al) in the barrier layer 112.

The difference between the embodiments of FIG. 3 and FIG. 2 is that the concentration profile of FIG. 3 is an arc 202. The atomic percentage of aluminum (Al) in the composition gradient layer 114 is also gradually increased from the value C1 to the value C2 in the depth direction from bottom to top. The other similar parts of FIG. 3 may refer to the aforementioned description of FIG. 2.

The difference between the embodiments of FIG. 4 and FIG. 2 is that the concentration profile of FIG. 4 is a step-shaped profile 203. The atomic percentage of aluminum (Al) in the composition gradient layer 114 is also gradually increased from the value C1 to the value C2 in the depth direction from bottom to top. The other similar parts of FIG. 4 may refer to the aforementioned description of FIG. 2. In another embodiment, the step-shaped profile 203 of FIG. 4 may be replaced with a wavy profile.

In addition, according to an embodiment of the present disclosure, the composition gradient layer 114 may contain a metal dopant. The metal dopant may be magnesium (Mg), cadmium (Cd), carbon (C), zinc (Zn), iron (Fe) or a combination thereof, but not limited thereto. In one embodiment, the composition gradient layer 114 may be doped with magnesium (Mg) to become a p-type composition gradient layer. Furthermore, according to an embodiment of the present disclosure, the atomic percentage of aluminum (Al) in the barrier layer 112 is not limited to a fixed value, and its concentration may vary slightly along the depth direction.

Figure 5:
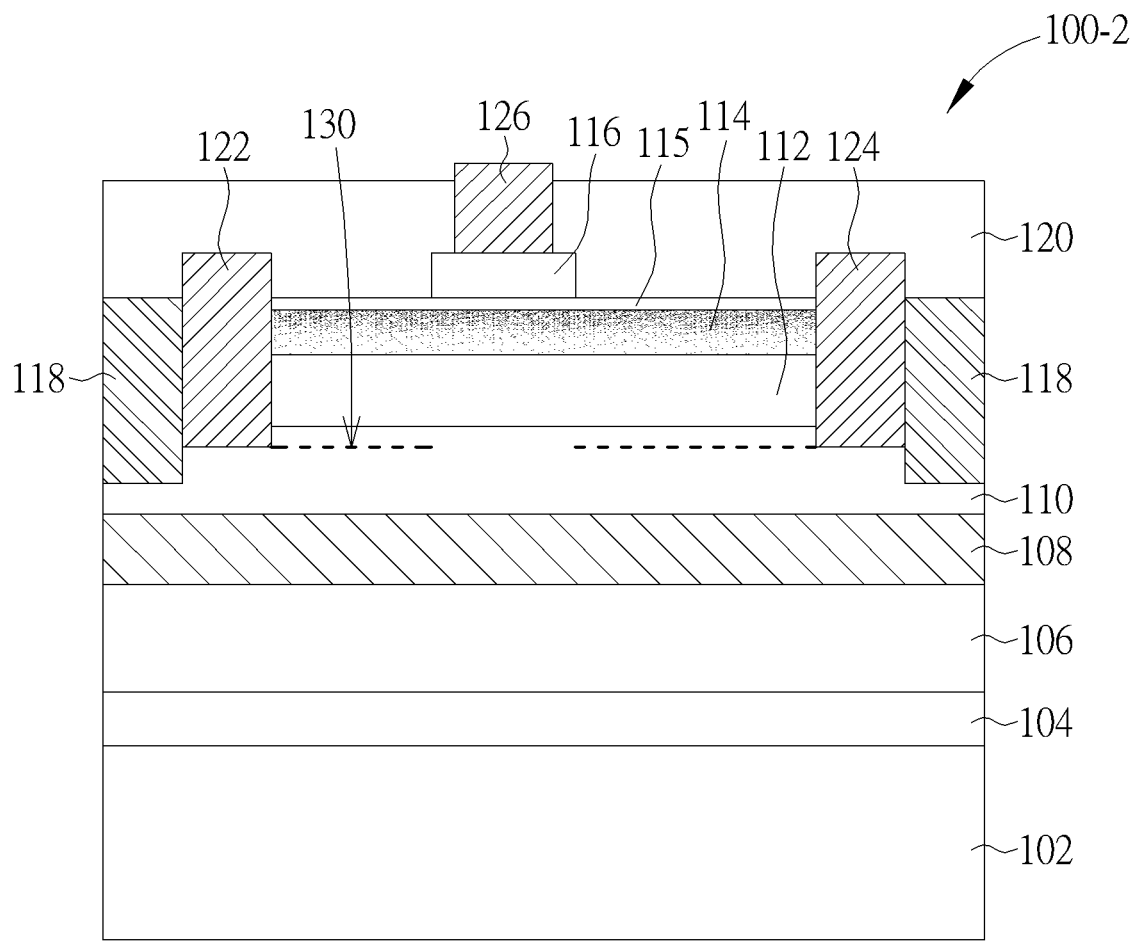
FIG. 5 is a schematic cross-sectional diagram of a HEMT having a cap layer according to another embodiment of the present disclosure.

FIG. 5 is a schematic cross-sectional diagram of a HEMT 100-2 according to another embodiment of the present disclosure. The difference between the HEMT 100-2 of FIG. 5 and the HEMT 100-1 of FIG. 1 is that a cap layer 115 is further disposed between the composition gradient layer 114 and the passivation layer 120 of the HEMT 100-2, and between the composition gradient layer 114 and the doped compound semiconductor layer 116 of the HEMT 100-2. The cap layer 115 is conformally disposed on the surface of the composition gradient layer 114. The cap layer 115 covers the entire surface of the composition gradient layer 114 between the source electrode 122 and the drain electrode 124. The passivation layer 120 is in contact with the top surface of the cap layer 115. According to an embodiment, the composition of the cap layer 115 may include the same group III element and the same group V element in the barrier layer 112 and the composition gradient layer 114. For example, the cap layer 115 may be an aluminum nitride (AlN) layer. In one embodiment, the average atomic concentration of the same group III element in the cap layer 115 is higher than the average atomic concentration of the same group III element in the composition gradient layer 114, for example, the average atomic concentration of aluminum (Al) in the cap layer 115 is higher than the average atomic concentration of aluminum (Al) in the composition gradient layer 114. In one embodiment, the atomic percentage of the same group III element in the cap layer 115 is higher than the atomic percentage of the same group III element in the composition gradient layer 114, for example, the aluminum (Al) atomic percentage of the cap layer 115 is higher than the aluminum (Al) atomic percentage of the composition gradient layer 114. In addition, according to an embodiment, the cap layer 115 may further include a metal dopant. The metal dopant may be magnesium (Mg), cadmium (Cd), carbon (C), zinc (Zn), iron (Fe) or a combination thereof, but not limited thereto. For example, the cap layer 115 may be doped with magnesium (Mg) to become a p-type cap layer. According to an embodiment, for the case where the average atomic concentration of the same group III element in the cap layer 115 is higher than the average atomic concentration of the same group III element in the composition gradient layer 114, the thickness of the cap layer 115 is 2% to 10% of the thickness of the composition gradient layer 114. The cap layer 115 in this thickness range will not affect the electrical performance of the HEMT, and may also protect the underlying composition gradient layer 114 during the etching process for forming the doped compound semiconductor layer 116. In contrast, when the thickness of the cap layer 115 exceeds 20% of the thickness of the composition gradient layer 114, the portion of the composition gradient layer 114 immediately adjacent to the bottom surface of the cap layer 115 will further generate 2-DEG therein, which affects the electrical performance of the HEMT.

Figure 6:
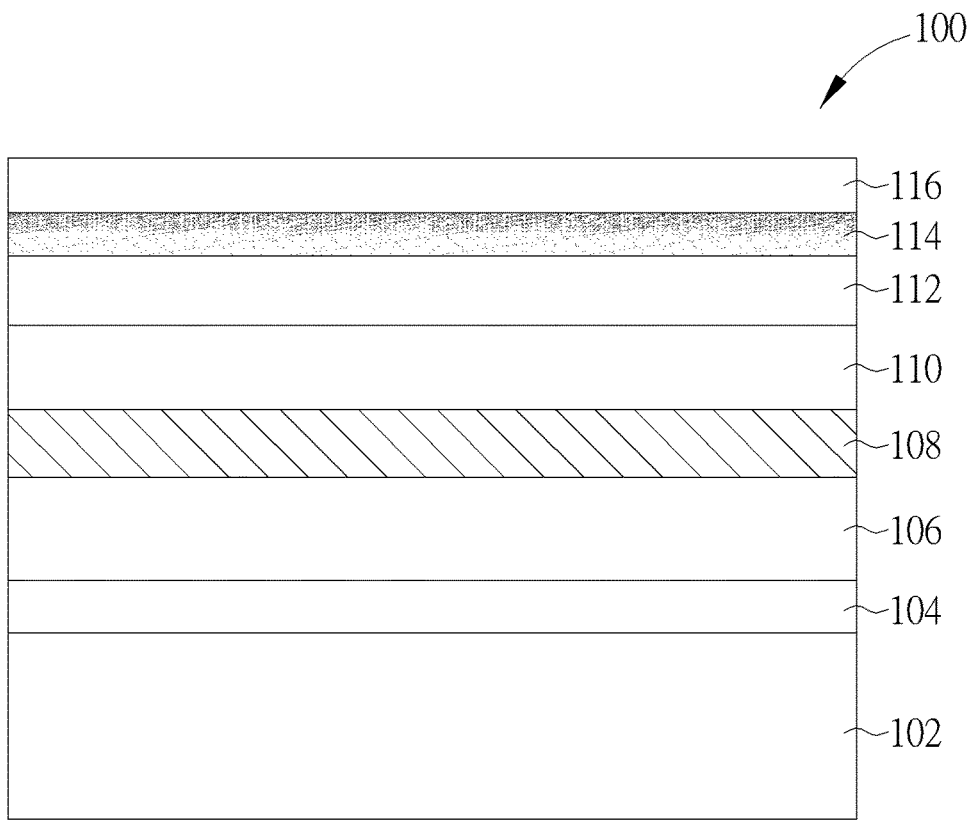
FIG. 6 is a schematic cross-sectional diagram of a semiconductor structure according to one embodiment of the present disclosure.

FIG. 6 is a schematic cross-sectional diagram of a semiconductor structure 100 according to an embodiment of the present disclosure. FIG. 7, FIG. 8, FIG. 9 and FIG. 10 are schematic cross-sectional diagrams of various intermediate stages of fabricating the HEMT 100-1 according to an embodiment of the present disclosure. According to an embodiment of the present disclosure, as shown in FIG. 6, a substrate 102 is provided, and a nucleation layer 104, a superlattice layer 106, a high resistance layer 108, a channel layer 110, a barrier layer 112, a composition gradient layer 114 and a doped compound semiconductor layer 116 are stacked in sequence on the substrate 102. In one embodiment, the substrate 102 may be a bulk silicon substrate, a silicon carbide (SiC) substrate, a sapphire substrate, a silicon-on-insulator (SOI) substrate, or a germanium-on-insulator (GOI) substrate, but not limited thereto. In another embodiment, the substrate 102 further includes a single or multiple layers of insulating material and/or other suitable material layers (such as a semiconductor layer) and a core layer. The insulating material layer may be oxide, nitride, oxynitride, or other suitable insulating materials. The core layer may be silicon carbide (SiC), aluminum nitride (AlN), aluminum oxide ($Al_2O_3$), aluminum gallium nitride (Al- GaN), zinc oxide (ZnO) or gallium oxide ($Ga_2O_3$), or other suitable ceramic materials. In one embodiment, the single or multiple layers of insulating material and/or other suitable material layers wraps the core material.

The nucleation layer 104 may be optionally disposed on the substrate 102, which has fewer lattice defects, so that the epitaxial quality of the superlattice layer 106 grown on the nucleation layer 104 may be improved. In one embodiment, the nucleation layer 104 may include an aluminum nitride (AlN) stacked layer, for example, including a first nitride layer and a second nitride layer. In one embodiment, the first nitride layer may be, for example, a low-temperature aluminum nitride layer (LT-AlN), and the second nitride layer may be, for example, a high-temperature aluminum nitride layer (HT-AlN). The LT-AlN layer may be deposited by metal-organic CVD (MOCVD) at an ambient temperature of 800° C. to 1100° C., and the HT-AlN layer may be deposited by MOCVD at an ambient temperature of 1100° C. to 1400° C., but not limited thereto.

The superlattice layer (SL) 106 may be optionally disposed on the substrate 102, for example, disposed on the nucleation layer 104. The SL layer 106 may be used to reduce the degree of lattice mismatch between the substrate 102 and the semiconductor layer on the SL layer 106, and to reduce the stress caused by the lattice mismatch. In one embodiment, the SL layer 106 may be a superlattice stacked layer, for example, including a first SL layer and a second SL layer. According to different requirements, the first SL layer and the second SL layer may each be a periodic alternating structure composed of at least two III-V compound semiconductors, for example, a structure composed of AlN thin layers/GaN thin layers that are alternately stacked. Alternatively, the first SL layer and the second SL layer may each be a group III-V compound semiconductor with gradually-varied composition ratio, such as aluminum gallium nitride ($Al_aGa_{(1-a)}N$, wherein $0.15 \leq a \leq 0.9$) whose composition ratio of aluminum is gradually decreased from bottom to top, but not limited thereto.

The high resistance layer 108 may be optionally disposed on the substrate 102, for example, disposed on the superlattice layer 106. The high resistance layer 108 has a higher resistivity than other layers, thereby avoiding leakage current between the semiconductor layer disposed on the high resistance layer 108 and the substrate 102. In one embodiment, the high resistance layer 108 may be a doped group III-V semiconductor layer, such as a carbon-doped gallium nitride (c-GaN) layer, but not limited thereto.

The channel layer 110 may be disposed on the substrate 102, for example, disposed on the high resistance layer 108. The channel layer 110 may include one or more group III-V semiconductor layers, and the composition of the group III-V semiconductor layer may be GaN, AlGaN, InGaN, or InAlGaN, but not limited thereto. In one embodiment, the channel layer 110 is an undoped group III-V semiconductor layer, such as an undoped GaN (u-GaN) layer. In other embodiments, the channel layer 110 may be one or more doped group III-V semiconductor layers, for example, a p-type group III-V semiconductor layer. For the p-type group III-V semiconductor layer, the dopant may be cadmium (Cd), iron (Fe), magnesium (Mg) or zinc (Zn), but not limited thereto.

The barrier layer 112 may be disposed on the channel layer 110. The barrier layer 112 may include one or more group III-V semiconductor layers, and the composition of the barrier layer 112 is different from the group III-V semiconductor of the channel layer 110. For example, the barrier layer 112 may include AlN, $Al_zGa_{(1-z)}N$ (0<z<1), or a combination thereof. In one embodiment, the barrier layer 112 may be an n-type group III-V semiconductor layer, such as an intrinsic n-type AlGaN layer, but not limited thereto.

Since there is a discontinuous energy gap between the channel layer 110 and the barrier layer 112, by stacking the channel layer 110 and the barrier layer 112 on each other, electrons will be gathered in the channel layer 110 due to the piezoelectric effect and are adjacent to the hetero-junction between the channel layer 110 and barrier layer 112. The gathered electrons may form a thin layer with high carrier mobility, that is, the two-dimensional electron gas (2-DEG) region 130.

According to an embodiment of the present disclosure, the composition gradient layer 114 may be formed on the barrier layer 112. The composition gradient layer 114 may include aluminum gallium nitride ($Al_xGa_{(1-x)}N$, wherein 0.2<x<0.4) or aluminum gallium indium nitride ($Al_xGa_{(1-x-y)}In_yN$, wherein 0.2<x<0.6, and 0<y<0.4). The aforementioned x and y are values that are changed with the depth of the composition gradient layer 114, where the value of x is gradually increased from bottom to top in the depth direction, and the value of y is gradually decreased from bottom to top in the depth direction. According to an embodiment, the composition gradient layer 114 may be formed by an atomic layer deposition (ALD) process, through adjusting the source gas ratio for depositing each atomic layer, such as adjusting the ratio of aluminum (Al), nitrogen (N), gallium (Ga) and/or indium (In) source gas may deposit a stack of multiple composition ratio gradient atomic layers to form the composition gradient layer 114, for example with aluminum (Al) atomic percentage or atomic concentration gradient. According to an embodiment, the thickness of the composition gradient layer 114 may be 2 nm to 10 nm, or may be 10% to 50% of the thickness of the barrier layer 112.

According to an embodiment of the present disclosure, the doped compound semiconductor layer 116 may be formed on the composition gradient layer 114 to achieve the normally-off state of the HEMT with a depleted 2-DEG region. The doped compound semiconductor layer 116 may be one or more group III-V semiconductor layers that are doped. The composition of the doped compound semiconductor layer 116 may be GaN, AlGaN, InGaN or InAlGaN, and the dopant may be C, Fe, Mg or Zn, but not limited thereto. In one embodiment, the doped compound semiconductor layer 116 may be a p-type GaN layer.

Figure 7:
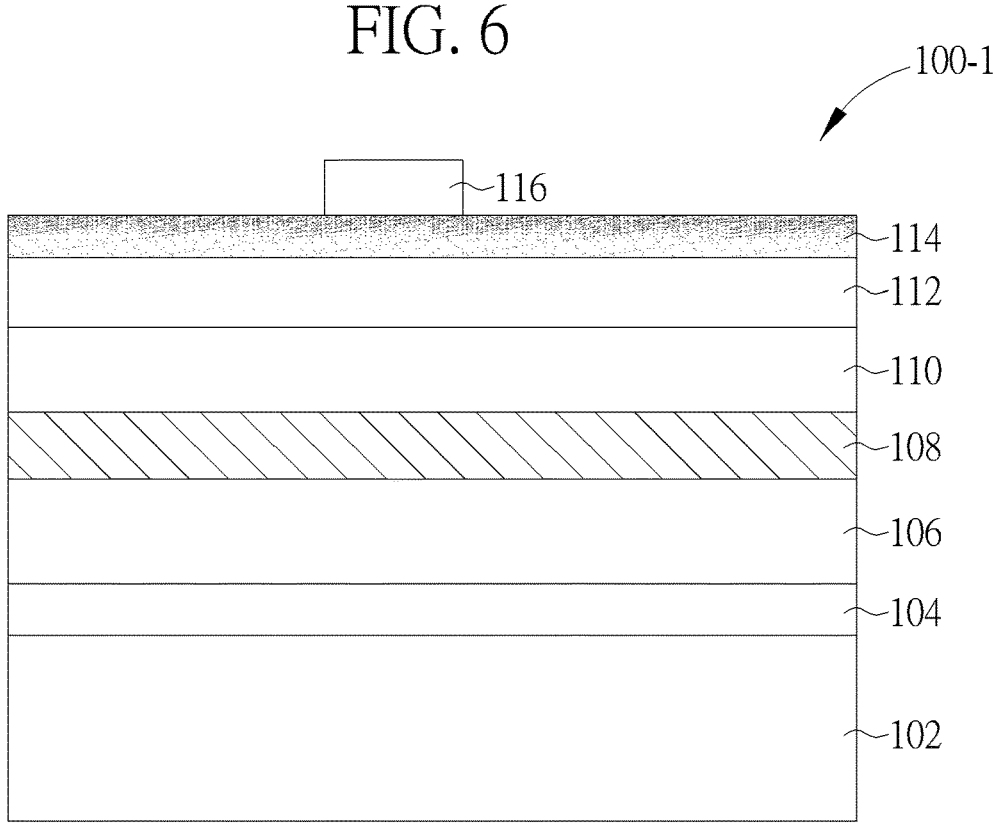
FIG. 7 is a schematic cross-sectional diagram of an intermediate stage of fabricating a HEMT according to one embodiment of the present disclosure, which includes a doped compound semiconductor layer disposed on a composition gradient layer.

According to an embodiment of the present disclosure, as shown in FIG. 7, a patterned doped compound semiconductor layer 116 is formed on the composition gradient layer 114. In one embodiment, the patterned doped compound semiconductor layer 116 may be formed by a photolithography process and an etching process. During the aforementioned etching process, the composition gradient layer 114 protects the underlying barrier layer 112, so that the process window of the etching process for forming the patterned doped compound semiconductor layer 116 is wider.

Figure 8:
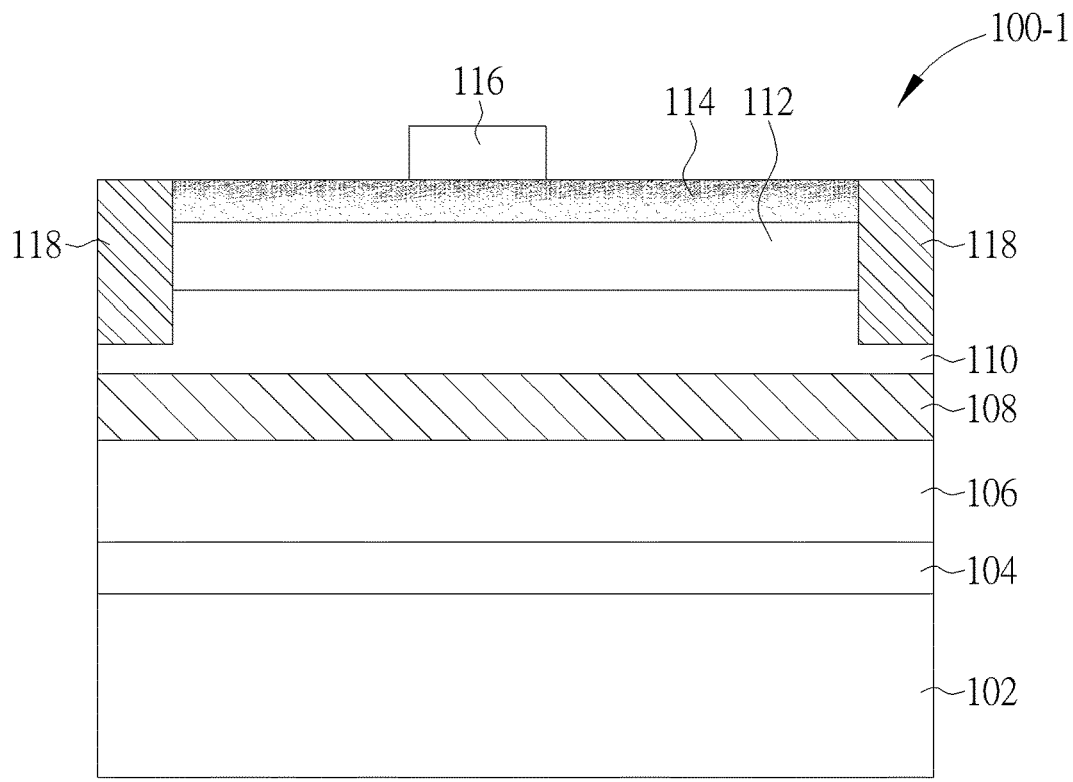
FIG. 8 is a schematic cross-sectional diagram of an intermediate stage of fabricating a HEMT according to one embodiment of the present disclosure, which includes an isolation region disposed on the periphery of the HEMT.

Next, according to an embodiment of the present disclosure, as shown in FIG. 8, an isolation region 118 is formed on the periphery of the HEMT to isolate the adjacent HEMTs from each other. According to an embodiment, the isolation region 118 passes through the composition gradient layer 114 and the barrier layer 112, and is extended downward to the channel layer 110. The isolation region 118 is separated from the high resistance layer 108 by a distance. In one embodiment, the isolation region 118 may be a shallow trench isolation (STI), which may form by performing an etching process to form a trench in the composition gradient layer 114, the barrier layer 112, and the channel layer 110, and then the trench is filled with one or more layers of dielectric materials, such as silicon oxide, silicon nitride, or a combination thereof, and performing a chemical mechanical polishing (CMP) process to form the isolation region 118. In another embodiment, the isolation region 118 may be formed by an ion implantation process. A hard mask is used to cover the area outside the predetermined area where the isolation region 118 is to be formed, and a dopant is implanted into the composition gradient layer 114, the barrier layer 112, and the channel layer 110 to form the isolation region 118. The dopant is, for example, helium or carbon. However, the present disclosure is not limited thereto, and those of ordinary skill in the art may adjust the depth of the isolation region 118 into other layers according to actual requirements.

Figure 9:
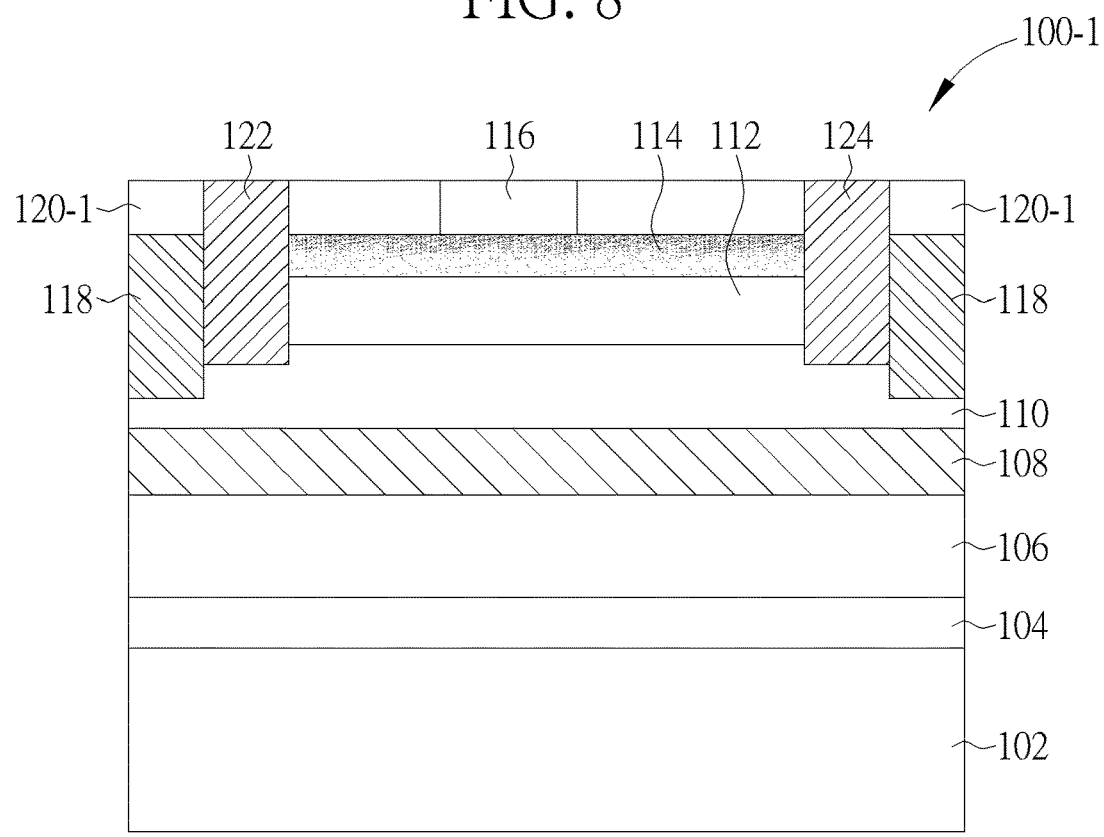
FIG. 9 is a schematic cross-sectional diagram of an intermediate stage of fabricating a HEMT according to one embodiment of the present disclosure, which includes a source electrode and a drain electrode.

Afterwards, according to an embodiment of the present disclosure, as shown in FIG. 9, a first passivation layer 120-1 is formed on the isolation region 118 and the composition gradient layer 114, and a source electrode 122 and a drain electrode 124 are formed on two sides of the doped compound semiconductor layer 116 respectively. In one embodiment, the first passivation layer 120-1 exposes the source electrode 122 and the drain electrode 124. The source electrode 122 and the drain electrode 124 pass through the composition gradient layer 114 and the barrier layer 112, and extend downward into the channel layer 110, so that the bottoms of the source electrode 122 and the drain electrode 124 are higher than the bottom of the isolation region 118 and lower than the top surface of the channel layer 110. In another embodiment, the source electrode 122 and the drain electrode 124 pass through the first passivation layer 120-1 and the composition gradient layer 114, and extend downward into the barrier layer 112, so that the bottoms of the source electrode 122 and the drain electrode 124 are higher than the bottom of the isolation region 118 and lower than the top surface of the barrier layer 112.

According to an embodiment, the first passivation layer 120-1 may be firstly deposited to cover the isolation region 118, the composition gradient layer 114 and the doped compound semiconductor layer 116. Next, contact holes of the source electrode 122 and the drain electrode 124 are formed on two sides of the doped compound semiconductor layer 116 respectively and in the first passivation layer 120-1, the composition gradient layer 114, the barrier layer 112 and the channel layer 110. Afterwards, a conductive material layer is deposited in the contact holes and on the first passivation layer 120-1. In one embodiment, the source electrode 122 and the drain electrode 124 may be formed through a CMP process, and the top surface of the doped compound semiconductor layer 116 is exposed, where the top surfaces of the source electrode 122 and the drain electrode 124 may be in the same level with the top surface of the doped compound semiconductor layer 116. In another embodiment, after the conductive material layer is deposited, an etching process may be used to remove the conductive material layer outside the contact holes to form the source electrode 122 and the drain electrode 124, and the top surface of the doped compound semiconductor layer 116 may still be covered by the first passivation layer 120-1.

According to an embodiment, the source electrode 122 and the drain electrode 124 may have a single-layered or multiple-layered structure, and the composition thereof may include an ohmic contact metal. The ohmic contact metal refers to a metal, an alloy or a stacked layer thereof that produces ohmic contact with a semiconductor layer (such as the channel layer 110). The ohmic contact metal is for example Ti, Ti/Al, Ti/Al/Ti/TiN, Ti/Al/Ti/Au, Ti/Al/Ni/Au or Ti/Al/Mo/Au, but not limited thereto.

Figure 10:
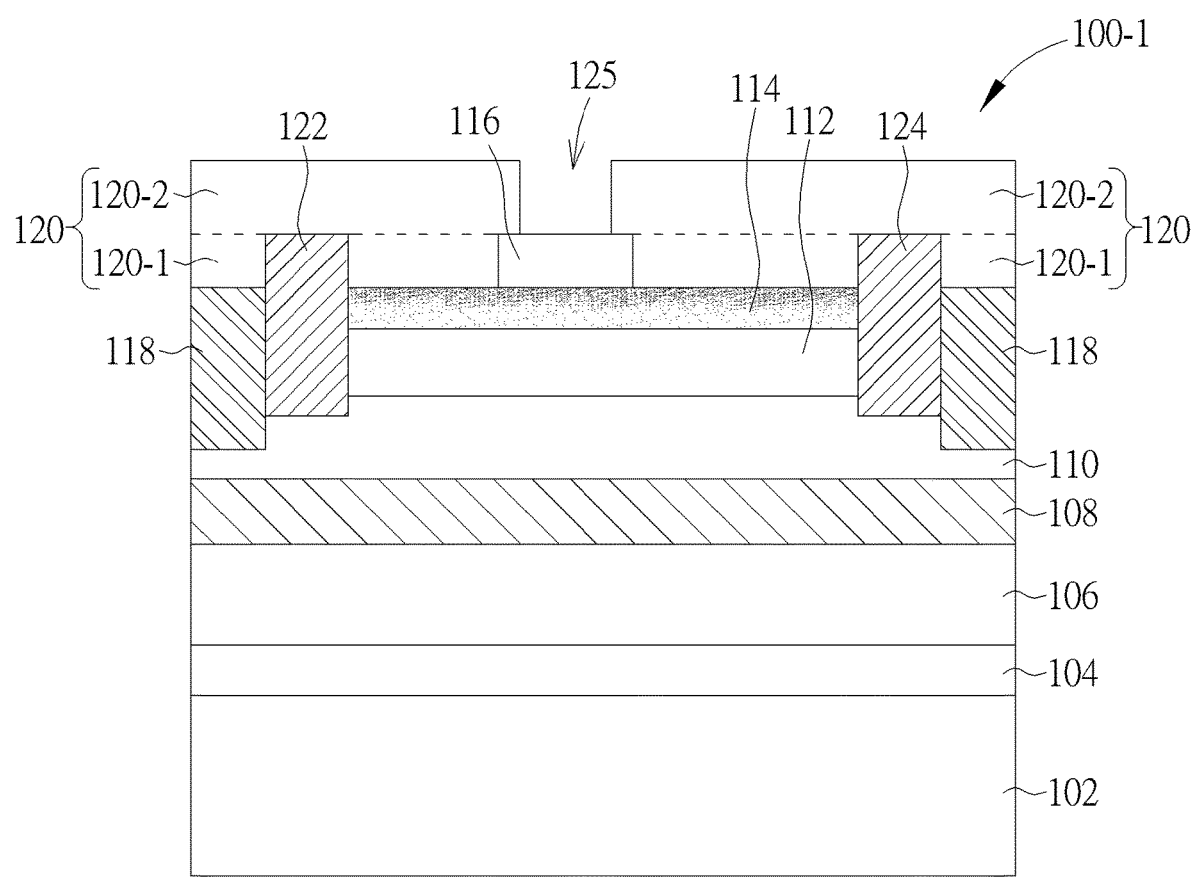
FIG. 10 is a schematic cross-sectional diagram of an intermediate stage of fabricating a HEMT according to one embodiment of the present disclosure, which includes a contact hole of a gate electrode.

Next, according to an embodiment of the present disclosure, as shown in FIG. 10, a second passivation layer 120-2 is formed to cover the first passivation layer 120-1, the doped compound semiconductor layer 116, the source electrode 122 and the drain electrode 124. The first passivation layer 120-1 and the second passivation layer 120-2 may be collectively referred to as the passivation layer 120. Then, a contact hole 125 of the gate electrode 126 is formed in the second passivation layer 120-2 to expose the top surface of the doped compound semiconductor layer 116. According to an embodiment of the present disclosure, for the case where an etch stop layer (not shown) is disposed on the top surface of the doped compound semiconductor layer 116, the etch stop layer may be exposed from the contact hole 125. The etch stop layer may be used to protect the doped compound semiconductor layer 116 and to prevent the doped compound semiconductor layer 116 from being in direct contact with the etchant used in the etching process of forming the contact hole 125. Afterwards, a conductive material layer is deposited in the contact hole 125 and on the second passivation layer 120-2. Then, the conductive material layer is patterned through a photolithography process and an etching process to form the gate electrode 126 as shown in FIG. 1. In one embodiment, the top surface of the gate electrode 126 is higher than the top surface of the passivation layer 120. In another embodiment, a part of the gate electrode 126 may further extend onto the top surface of the passivation layer 120.

According to an embodiment, the gate electrode 126 may have a single-layered or multiple-layered structure, for example, a double-layered structure including a first conductive layer and a second conductive layer. Where, the first conductive layer may be in direct contact with the doped compound semiconductor layer 116, and its composition includes a Schottky contact metal. The Schottky contact metal refers to a metal, an alloy or a stacked layer thereof that produces Schottky contact with a semiconductor layer (such as the doped compound semiconductor layer 116). The Schottky contact metal is for example TiN, W, Pt, Ni or Ni, but not limited thereto. The composition of the second conductive layer may include Ti, Al, Au, or Mo, but not limited thereto. In one embodiment, the first conductive layer may further include a metal nitride of a refractory metal. The refractory metal may be selected from a group consisting of titanium, zirconium, hafnium, vanadium, niobium, tantalum, chromium, molybdenum, tungsten, manganese, tectonium, rhenium, Ruthenium, osmium, rhodium and iridium.

According to an embodiment of the present disclosure, the materials of the first passivation layer 120-1 and the second passivation layer 120-2 include aluminum oxide ($Al_2O_3$), silicon nitride ($Si_3N_4$), silicon oxynitride (SiON), aluminum nitride (AlN), or silicon oxide ($SiO_2$). In one embodiment, the materials of the first passivation layer 120-1 and the second passivation layer 120-2 may be the same. In another embodiment, the materials of the first passivation layer 120-1 and the second passivation layer 120-2 may be different from each other.

According to an embodiment of the present disclosure, for the HEMT 100-2 as shown in FIG. 5, the difference between the fabrication method of the HEMT 100-2 of FIG. 5 and the fabrication method of the HEMT 100-1 of FIG. 1 is that before forming the doped compound semiconductor layer 116, a cap layer 115 is firstly formed on the composition gradient layer 114, and then the doped compound semiconductor layer 116 is formed on the cap layer 115. The isolation region 118 is formed in the cap layer 115, the composition gradient layer 114, the barrier layer 112 and the channel layer 110. Afterwards, the passivation layer 120 is formed to cover the doped compound semiconductor layer 116 and the cap layer 115. The source electrode 122 and the drain electrode 124 are subsequently formed to pass through the cap layer 115. In this embodiment, during the etching process of forming the patterned doped compound semiconductor layer 116, the cap layer 115 protects the underlying composition gradient layer 114. Therefore, the process window of the etching process of forming the patterned doped compound semiconductor layer 116 is further widened. Meanwhile, the thickness of the cap layer 115 is very thin, so that the cap layer 115 will not affect the 2-DEG performance of the HEMT.

According to the embodiments of the present disclosure, one purpose of the composition gradient layer disposed between the barrier layer and the passivation layer may be to reduce or eliminate the surface polarization of the barrier layer, thereby preventing the surface leakage current between the gate electrode and the source electrode, and between the gate electrode and the drain electrode of the HEMTs. As a result, the on-off switching control of the HEMTs is more accurate, and the 2-DEG performance of the HEMTs is also maintained, thereby improving the electrical performance of the HEMTs. In addition, the placements of the composition gradient layer and the cap layer also improve the process window of the etching process of forming the patterned doped compound semiconductor layer on the composition gradient layer or the cap layer, thereby enhancing the fabrication yield of the HEMTs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a buffer layer, disposed on a substrate;
    a channel layer, disposed on the buffer layer;
    a barrier layer, disposed on the channel layer;
    a doped compound semiconductor layer, disposed on the barrier layer; and
    a composition gradient layer, disposed between the barrier layer and the doped compound semiconductor layer, wherein the barrier layer and the composition gradient layer include a same group III element and a same group V element, and an atomic percentage of the same group III element in the composition gradient layer is gradually increased in a direction from the barrier layer to the doped compound semiconductor layer.

2. The semiconductor structure of claim 1, wherein an overall atomic percentage of the same group III element in the composition gradient layer is higher than an atomic percentage of the same group III element in the barrier layer.

3. The semiconductor structure of claim 1, wherein the composition gradient layer includes a metal dopant and the metal dopant includes magnesium, cadmium, carbon or zinc.

4. The semiconductor structure of claim 1, further comprising a cap layer disposed between the composition gradient layer and the doped compound semiconductor layer, wherein the composition of the cap layer includes the same group III element and the same group V element, and the thickness of the cap layer is 2% to 10% of the thickness of the composition gradient layer.

5. The semiconductor structure of claim 4, wherein an average atomic concentration of the same group III element in the cap layer is higher than an average atomic concentration of the same group III element in the composition gradient layer.

6. The semiconductor structure of claim 1, wherein the barrier layer comprises aluminum gallium nitride ($Al_zGa_{(1-z)}N$, wherein $0<z<1$), and the composition gradient layer comprises aluminum gallium nitride ($Al_xGa_{(1-x)}N$, wherein $0.2<x<0.4$) or aluminum gallium indium nitride ($Al_xGa_{(1-x-y)}In_yN$, wherein $0.2<x<0.6$, and $0<y<0.4$), and the same group III element is aluminum (Al).

7. The semiconductor structure of claim 1, wherein the thickness of the composition gradient layer is 10% to 50% of the thickness of the barrier layer.

8. The semiconductor structure of claim 1, wherein the composition gradient layer is conformally disposed on a surface of the barrier layer.

9. The semiconductor structure of claim 1, wherein a concentration profile of the same group III element in the composition gradient layer comprises a straight line profile, an arc profile, a step-shaped profile or a wavy profile.

10. A high electron mobility transistor (HEMT), comprising:
    a semiconductor structure of claim 1;
    a gate electrode, disposed on the doped compound semiconductor layer;
    a source electrode and a drain electrode, disposed on two sides of the gate electrode respectively; and
    a passivation layer, covering the gate electrode, the source electrode and the drain electrode.

11. The high electron mobility transistor of claim 10, wherein the passivation layer comprises aluminum oxide ($Al_2O_3$), silicon nitride ($Si_3N_4$), silicon oxynitride (SiON), aluminum nitride (AlN), or silicon oxide ($SiO_2$).

12. The high electron mobility transistor of claim 10, wherein the passivation layer is in contact with a part of a top surface of the composition gradient layer.

13. The high electron mobility transistor of claim 10, further comprising a cap layer disposed between the doped compound semiconductor layer and the composition gradient layer, and between the passivation layer and the composition gradient layer, wherein the passivation layer is in contact with a top surface of the cap layer.

14. The high electron mobility transistor of claim 10, wherein the composition gradient layer covers an entire surface of the barrier layer between the source electrode and the drain electrode.

* * * * *